(12) United States Patent
Tanaka et al.

(10) Patent No.: US 8,304,352 B2
(45) Date of Patent: Nov. 6, 2012

(54) METHOD OF MANUFACTURING A SEMICONDUCTOR DEVICE

(75) Inventors: Masayuki Tanaka, Yokohama (JP); Kazuhiro Matsuo, Yokkaichi (JP); Yoshio Ozawa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 48 days.

(21) Appl. No.: 13/051,031

(22) Filed: Mar. 18, 2011

(65) Prior Publication Data
US 2012/0094476 A1  Apr. 19, 2012

(30) Foreign Application Priority Data
Oct. 14, 2010  (JP) .................................. 2010-231742

(51) Int. Cl.
*H01L 21/31* (2006.01)
*H01L 21/469* (2006.01)

(52) U.S. Cl. ........... 438/775; 257/E21.18; 257/E21.302; 438/591; 438/769; 438/770; 438/786; 438/791; 438/954

(58) Field of Classification Search ............. 257/E21.18, 257/E21.302; 438/591, 769, 770, 775, 786, 438/791, 954
See application file for complete search history.

(56) References Cited

U.S. PATENT DOCUMENTS

| | | | | |
|---|---|---|---|---|
| 5,661,056 A | * | 8/1997 | Takeuchi | 438/261 |
| 7,510,935 B2 | * | 3/2009 | Lee et al. | 438/261 |
| 7,972,927 B2 | * | 7/2011 | Fujitsuka et al. | 438/264 |
| 2006/0240619 A1 | | 10/2006 | Ozawa et al. | |
| 2007/0196985 A1 | | 8/2007 | Ozawa et al. | |
| 2010/0102377 A1 | | 4/2010 | Iikawa et al. | |
| 2010/0136780 A1 | * | 6/2010 | Natori et al. | 438/591 |
| 2010/0197130 A1 | | 8/2010 | Ozawa et al. | |
| 2011/0053339 A1 | | 3/2011 | Ozawa | |
| 2011/0294304 A1 | * | 12/2011 | Ozawa et al. | 438/763 |
| 2012/0034772 A1 | * | 2/2012 | Ishida et al. | 438/591 |
| 2012/0074486 A1 | * | 3/2012 | Lue et al. | 257/324 |
| 2012/0112263 A1 | * | 5/2012 | Tanaka et al. | 257/316 |
| 2012/0139029 A1 | * | 6/2012 | Yaegashi | 257/324 |

FOREIGN PATENT DOCUMENTS
JP      2009-295617      12/2009

* cited by examiner

*Primary Examiner* — Asok Sarkar
(74) *Attorney, Agent, or Firm* — Finnegan, Henderson, Farabow, Garrett & Dunner, L.L.P.

(57) ABSTRACT

According to an embodiment, there is provided a method of manufacturing a semiconductor device, including forming a nitride film by nitriding a surface of an underlying region having a semiconductor region containing silicon as a main component and an insulating region containing silicon and oxygen as a main component and adjacent to the semiconductor region, carrying out oxidation with respect to the nitride film to convert a portion of the nitride film which is formed on the insulating region into an oxide film and to leave a portion of the nitride film which is formed on the semiconductor region as at least part of a charge storage insulating film, forming a block insulating film on the charge storage insulating film, and forming a gate electrode film on the block insulating film.

18 Claims, 8 Drawing Sheets

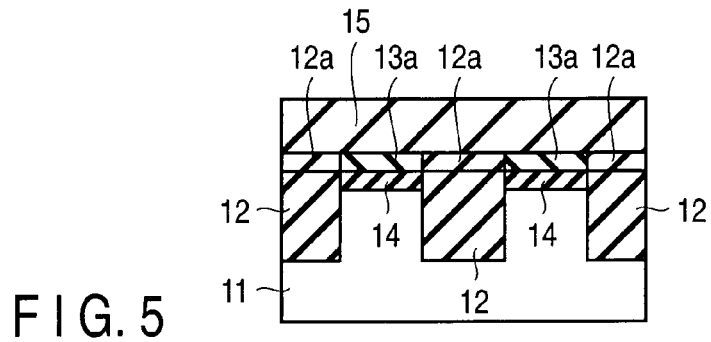
F I G. 5
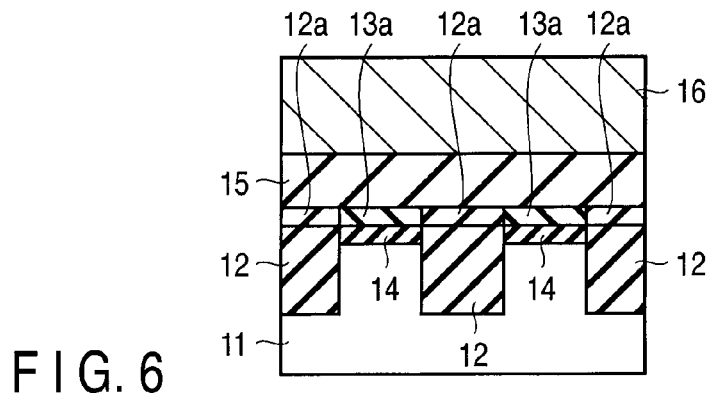
F I G. 6
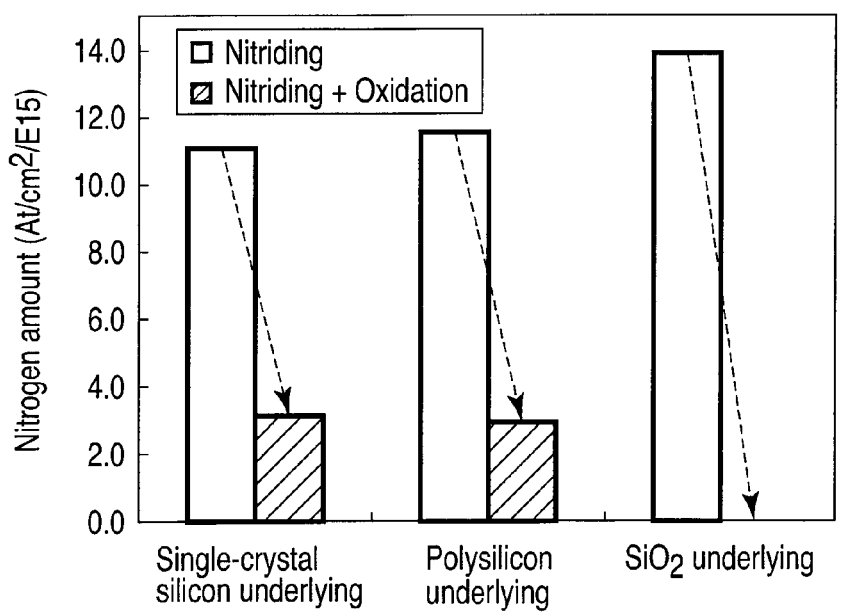
F I G. 7

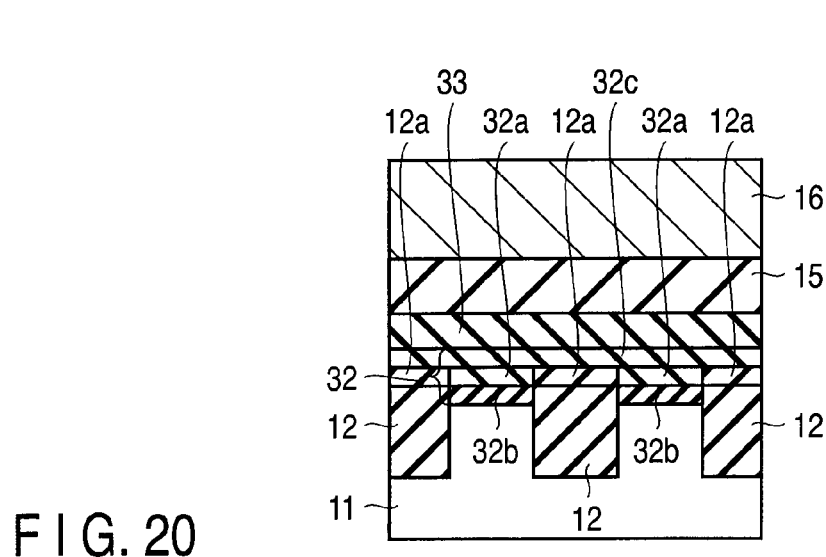
FIG. 19
FIG. 20
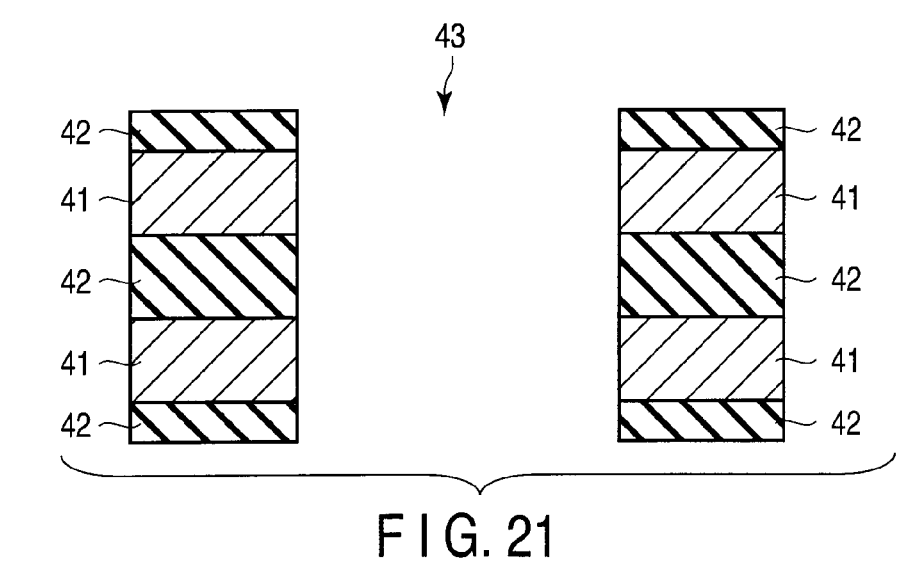
FIG. 21

US 8,304,352 B2

METHOD OF MANUFACTURING A SEMICONDUCTOR DEVICE

CROSS-REFERENCE TO RELATED APPLICATIONS

This application is based upon and claims the benefit of priority from Japanese Patent Application No. 2010-231742, filed Oct. 14, 2010; the entire contents of which are incorporated herein by reference.

FIELD

Embodiments described herein relate generally to a method of manufacturing a semiconductor device.

BACKGROUND

A charge trap nonvolatile semiconductor memory using a charge trap charge storage insulating film as a charge storage layer has been proposed. In the charge trap nonvolatile semiconductor memory, a charge injected to a charge storage insulating film through a tunnel insulating film is trapped in a trap level of the charge storage insulating film. In this way, a charge is stored in the charge storage insulating film. A block insulting film for blocking a charge is provided between a charge storage insulating film and a control gat electrode. A MONOS or SONOS nonvolatile semiconductor memory has been known as a typical example of the charge trap nonvolatile semiconductor memory.

However, the foregoing charge trap nonvolatile semiconductor memory has the following problem on the reliability. Specifically, if a charge storage insulating film is continuously formed between neighboring memory cells, a charge stored in the charge storage insulating film leaks. Moreover, if a tunnel insulating film or block insulating film is continuously formed between neighboring memory cells, there is a possibility that a problem on the reliability arises.

In order to solve the foregoing problem, the foregoing charge storage insulating film, tunnel insulating film or block insulating film is not continuously formed between neighboring memory cells. This is effective. However, according to the conventional case, a method of effectively forming a charge storage insulating film, tunnel insulating film or block insulating film has not been proposed. Therefore, it is difficult to form a semiconductor device, which is excellent in reliability.

BRIEF DESCRIPTION OF THE DRAWINGS

FIG. 5 is a cross-sectional view schematically showing a process of a method of manufacturing a semiconductor device according to a first embodiment;

FIG. 6 is a cross-sectional view schematically showing a process of a method of manufacturing a semiconductor device according to a first embodiment;

FIG. 7 is a graph showing the experimental result of selective oxidizing;

FIG. 19 is a cross-sectional view schematically showing a process of a method of manufacturing a semiconductor device according to a third embodiment;

FIG. 20 is a cross-sectional view schematically showing a process of a method of manufacturing a semiconductor device according to a third embodiment;

FIG. 21 is a cross-sectional view schematically showing a process of a method of manufacturing a semiconductor device according to a fourth embodiment;

DETAILED DESCRIPTION

In general, according to one embodiment, there is provided a method of manufacturing a semiconductor device, comprising: forming a nitride film by nitriding a surface of an underlying region having a semiconductor region containing silicon as a main component and an insulating region containing silicon and oxygen as a main component and adjacent to the semiconductor region; carrying out oxidation with respect to the nitride film to convert a portion of the nitride film which is formed on the insulating region into an oxide film and to leave a portion of the nitride film which is formed on the semiconductor region as at least part of a charge storage insulating film; forming a block insulating film on the charge storage insulating film; and forming a gate electrode film on the block insulating film.

Hereinafter, various embodiments will be described with reference to the accompanying drawings. In the following each embodiment, a charge trap nonvolatile semiconductor memory using a charge trap charge storage insulating film as a charge storage layer will be described as a semiconductor device.

Embodiment 1

FIGS. 1 to 6 are cross-sectional views schematically showing a method of manufacturing a semiconductor device according to a first embodiment.

Figure 1:
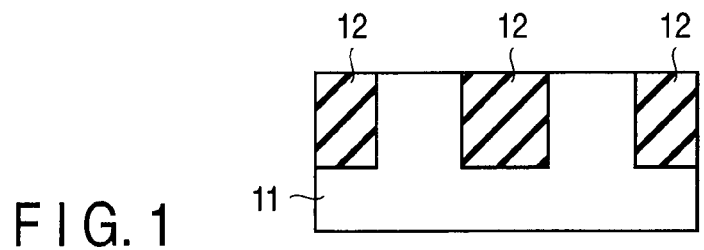
FIG. 1 is a cross-sectional view schematically showing a process of a method of manufacturing a semiconductor device according to a first embodiment.

As shown in FIG. 1, a trench is formed on a surface of a p-type silicon substrate (or p-well is formed on an n-type silicon substrate) 11. The trench is filled with a silicon oxide to form an isolation insulating film 12. In this way, an underlying region having a semiconductor region (i.e., silicon substrate 11) and an insulating region (i.e., isolation insulating film 12) adjacent to the semiconductor region is obtained.

Although not specially illustrated in FIG. 1, usually, a thin oxide film (silicon oxide film having a thickness of about 1 nm or less) is formed on the surface of the silicon substrate 11. Specifically, in order to prevent an influence of an age-based change, a silicon oxide film formed according to a chemical method and a native oxide are formed.

Figure 2:
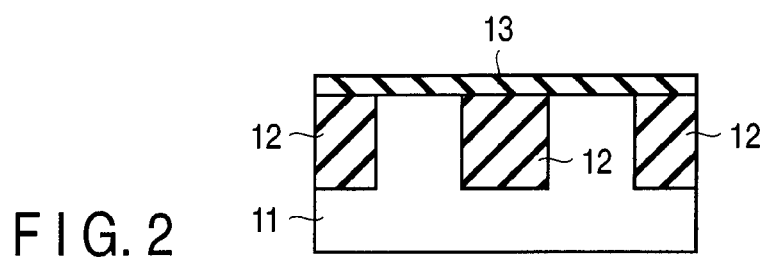
FIG. 2 is a cross-sectional view schematically showing a process of a method of manufacturing a semiconductor device according to a first embodiment.

As illustrated in FIG. 2, the surface of the underlying region having the silicon substrate 11 and the isolation insulating film 12 is nitrided to form a silicon nitride film 13. The silicon nitride film 13 is formed using radical nitriding. Specifically, a microwave is generated in the atmosphere containing nitrogen gas to form nitrogen radical. Using the nitrogen radical, a silicon nitride film 13 is formed on the surface of the silicon substrate 11 and the isolation insulating film 12. The microwave intensity is 100 to 300 W, a treatment pressure is 5 to 30 Pa, and the substrate temperature is 350 to 900° C. The formed silicon nitride film 13 has a thickness of 1 to 10 nm. After the foregoing nitriding, a thin oxide film (having a thickness of about 1 nm or less) formed according to a chemical method may be left on the surface of the silicon substrate 11.

Figure 3:
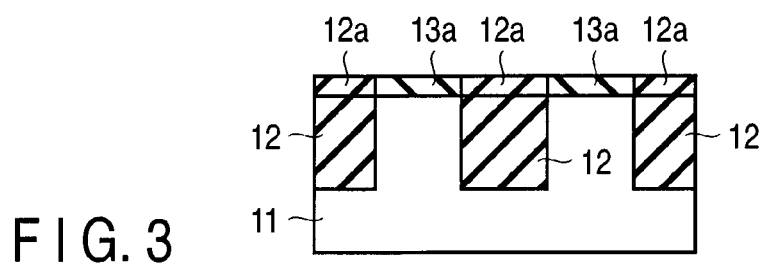
FIG. 3 is a cross-sectional view schematically showing a process of a method of manufacturing a semiconductor device according to a first embodiment.

As depicted in FIG. 3, oxidation is carried out with respect to the silicon nitride film 13. According to the foregoing oxidation, a portion formed on the isolation insulating film 12 of the silicon nitride film 13 is converted into a silicon oxide film 12a. On the other hand, a portion 13a formed on the semiconductor substrate 11 of the silicon nitride film 13 is left as a nitride film. The silicon nitride film 13a left on the semiconductor substrate 11 functions as a charge storage insulating film.

The foregoing oxidation is carried out using radical oxidizing. Specifically, the following method is given; namely, oxygen is excited by a microwave in the atmosphere containing oxygen gas to form oxygen radical. In this case, hydrogen gas may be contained in the atmosphere containing oxygen gas. Moreover, the following method is given as another method; namely, oxygen gas and hydrogen gas are supplied to the surface of a substrate kept at high temperature to form oxygen radical. According to this embodiment, radical oxidizing is carried out using the latter method. The treatment condition is set as follows. Specifically, 0.5 to 10% of the flow rate of a mixed gas of oxygen gas and hydrogen gas is set as the flow rate of hydrogen gas, and the treatment temperature is 700 to 1000° C. The oxidation (i.e., oxide film thickness) is determined from the relation with the thickness of the silicon nitride film 13. For example, radical oxidation is carried out under the condition that a silicon oxide film having a thickness of less than 3 nm is formed on the surface of a silicon (100) single-crystal substrate. Oxidation (i.e., oxide film thickness) is properly set, and thereby, a silicon oxide film 12a is formed on the isolation insulating film 12 as shown in FIG. 3. The silicon nitride film 13a is left on the semiconductor substrate 11.

FIG. 7 is a graph showing the experimental result of the foregoing selective oxidation.

FIG. 7 shows the following experimental results. One is the experimental result that radical nitriding is carried out with respect to three kinds of underlying region (single-crystal silicon, polysilicon and silicon oxide film ($SiO_2$ film)). The other is the experimental result that radical nitriding and radical oxidation are carried out with respect to the foregoing underlying regions. In this case, when the underlying region is formed of each sample of single-crystal silicon and polysilicon, an oxide film (having a thickness of 1 nm or less) formed according to a chemical method is formed on the surface of the underlying region. This is because of preventing an influence of an age-based change.

"Nitriding" is carried out; as a result, single-crystal silicon sample and polysilicon sample contains nitrogen of about $11\times10^{15}$ $cm^{-2}$. Moreover, a silicon oxide film sample contains nitrogen of about $14\times10^{15}$ $cm^{-2}$. Then, radical oxidation was carried out with respect to the foregoing samples, which were subjected to radical nitriding. The foregoing "nitriding+oxidation" treatment was carried out; as a result, nitrogen of about $3\times10^{15}$ $cm^{-2}$ was left in single-crystal silicon sample and polysilicon sample. On the other hand, contained nitrogen decreases to the detection limit or less in the silicon oxide film sample.

The reason why the foregoing result is obtained is as follows. If the underlying region is silicon, a silicon nitride film having high oxidation resistance is formed according to radical nitriding. If the underlying region is a silicon oxide film, a silicon nitride film having low oxidation resistance is formed according to radical nitriding. For this reason, when radical oxidation is carried out, nitrogen is sufficiently left in the sample in which radical nitriding is carried out with respect to a silicon underlying region. In contrast to above, nitrogen is easily detached in the sample in which radical nitriding is carried out with respect to the silicon oxide film underlying region.

As can be seen from the foregoing description, in the process of FIG. 3, the silicon nitride film 13 is converted into a silicon oxide film 12a in a region of the isolation insulating film 12. Moreover, the silicon nitride film 13 is left as a nitride film 13a in a region of the semiconductor substrate 11. The silicon oxide film 12a is substantially formed as a part of an isolation insulating film while the nitride film 13a is formed as a charge storage insulating film.

Figure 4:
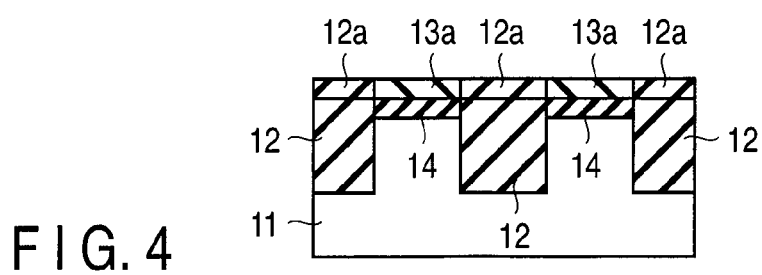
FIG. 4 is a cross-sectional view schematically showing a process of a method of manufacturing a semiconductor device according to a first embodiment.

As seen from FIG. 4, a tunnel insulating film 14 is formed between a portion formed with the silicon nitride film 13a and the semiconductor substrate 11. The tunnel insulating film 14 is obtained in the following manner. Namely, a thickness of a thin silicon oxide film (previously formed according to a chemical method) formed on the surface of the silicon substrate 11 (between silicon substrate 11 and silicon nitride film 13a) is uniquely increased according to oxidation. For example, oxidation is carried out under the condition that an oxygen partial pressure is several tens of mTorr to several hundreds of Torr in the oxygen atmosphere at the temperature of 700° C. for 5 to 60 minutes at low pressure or dilution atmosphere. In this way, a silicon oxide film having a thickness of about 1 to 5 nm is formed as the tunnel insulating film 14. When the foregoing oxidation is carried out, it is preferable to use an oxidizing agent, which is hard to oxidize a silicon nitride film and has a relatively long diffusion distance. For example, oxygen, water, dinitrogen monoxide and nitrogen dioxide are given as the foregoing oxidizing agent.

As shown in FIG. 5, a silicon oxide film having a thickness of about 2 to 20 nm is formed as a block insulating film 15 on the silicon oxide film 12a and the silicon nitride film (i.e., charge storage insulating film) 13a. The block insulating film 15 is formed using a deposition process such as a chemical vapor deposition (CVD) process, an atomic layer deposition (ALD) process and a physical vapor deposition (PVD) process. For example, according to the CVD process, a silicon oxide film is formed at the film-formation temperature of 800° C. using dichlorosilane as a silicon source and using dinitrogen monoxide as an oxidizing agent. According to the ALD process, an organic source is used as a silicon source, and ozone, oxygen, water and oxygen radical are used as an oxidizing agent. According to the ALD process, it is possible to form a silicon oxide film at the temperature of 600° C. or less.

As illustrated in FIG. 6, a gate electrode film 16 functioning as a control gate electrode is formed on the block insulating film 15. Specifically, a polysilicon film having a thickness of 10 to 200 nm is formed as the foregoing gate electrode film 16.

In the manner described above, the structure shown in FIG. 6 is formed, and thereafter, the gate electrode film 16 is patterned to obtain a nonvolatile semiconductor device.

According to this embodiment, the charge storage insulating film 13a is not continuously formed between neighboring memory cells as can be seen from FIG. 6; therefore, the charge storage insulating film 13a is separated. This serves to solve a problem that a charge stored in the charge storage insulating film 13a leaks in the horizontal direction. Moreover, extra holes injected in an erase operation do not exist between memory cells. Therefore, this serves to solve a problem that stored electrons are extinct because of being combined with extra holes. As a result, it is possible to prevent the reduction of charge retention characteristic, and thus, to obtain a semiconductor device having high reliability.

According to this embodiment, radical nitriding is carried out with respect to the surface of the underlying region having the silicon region (i.e., silicon substrate 11) and the silicon oxide film region (i.e., isolation insulating film 12) to form the silicon nitride film 13. Further, radical oxidation is carried out with respect to the silicon nitride film 13. In this way, the silicon oxide film 12a is formed on the isolation insulating film 12 while the silicon nitride film 13a is left on the silicon substrate 11. Therefore, it is possible to form a self-aligned silicon nitride film 13a between isolation regions formed of the isolation insulating film 12 and the silicon oxide film 12a. As a result, a silicon nitride film 13a functioning as a charge storage insulating film is formed in the memory cell region only. Therefore, it is possible to effectively form a semiconductor device, which has the foregoing effect and is excellent in reliability.

According to the foregoing embodiment, the semiconductor region (i.e., silicon substrate 11) is formed using silicon. In this case, silicon may be contained in the semiconductor region 11 as a main component. For example, the semiconductor region may be formed of SiGe (i.e., silicon germanium).

According to the foregoing embodiment, the insulating region (isolation insulating film 12) is formed of a silicon oxide film. In this case, silicon and oxygen are contained in the insulating region 12 as a main component.

According to the foregoing embodiment, the nitride film 13 is formed of a silicon nitride film. In this case, silicon and nitrogen are contained in the nitride film 13 as a main component.

According to the foregoing embodiment, the oxide film 12a is formed of a silicon oxide film. In this case, silicon and oxygen are contained in the oxide film 12a as a main component.

According to the foregoing embodiment, the nitride film 13a left on the semiconductor substrate 11 after radical oxidation is formed as a silicon nitride film. In this case, silicon and nitrogen may be contained in the nitride film 13a as a main component.

According to the foregoing embodiment, the charge storage insulating film is formed of a single layer of the nitride film 13a. In this case, the charge storage insulating film may be formed of plural layers containing the nitride film 13a. Specifically, an insulating film having a charge trap such as a hafnium oxide or zirconium oxide may be formed on the nitride film 13a to form a charge storage insulating film. The foregoing hafnium oxide or zirconium oxide is formable using a deposition process such as a CVD process, an ALD process and a PVD process. As described above, the charge storage insulating film is formed of plural layers, and thereby, it is possible to form a memory cell having a thick charge storage insulating film.

The foregoing various matters are applied to other embodiments.

Embodiment 2

FIGS. 8 to 13 are cross-sectional views schematically showing a method of manufacturing a semiconductor device according to a second embodiment. The basic matters are the same as the first embodiment; therefore, the explanation about the matters described in the first embodiment is omitted.

According to the first embodiment, radical nitriding and radical oxidation are carried out, and thereafter, a tunnel insulating film is formed. According to this second embodiment, a tunnel insulating film is formed before the foregoing radical nitriding and radical oxidation are carried out.

Figure 8:
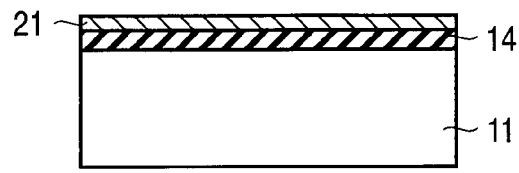
FIG. 8 is a cross-sectional view schematically showing a process of a method of manufacturing a semiconductor device according to a second embodiment.

As shown in FIG. 8, a silicon oxide film is formed as a tunnel insulating film 14 on a silicon substrate 11. Further, a silicon film 21 having a thickness of about 1 to 10 nm is formed on the tunnel insulating film 14. In this way, a structure having the tunnel insulating film 14 and a semiconductor region (i.e., silicon film 21) formed thereon is obtained.

Figure 9:
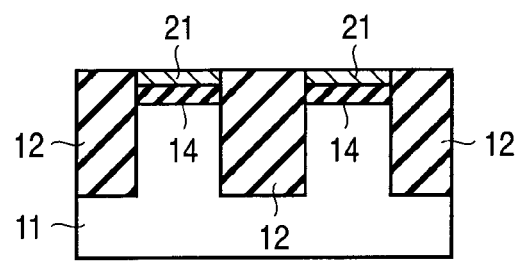
FIG. 9 is a cross-sectional view schematically showing a process of a method of manufacturing a semiconductor device according to a second embodiment.

As illustrated in FIG. 9, the foregoing silicon substrate 11, tunnel insulating film 14 and silicon film 21 are etched to form a trench. The trench is filled with a silicon oxide film to form an isolation insulating film 12. In this way, an underlying region having a semiconductor region (i.e., silicon film 21) and an insulating region (i.e., isolation insulating film 12) adjacent thereto is obtained.

Figure 10:
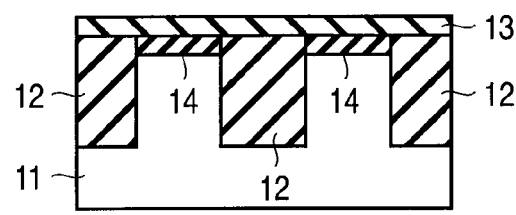
FIG. 10 is a cross-sectional view schematically showing a process of a method of manufacturing a semiconductor device according to a second embodiment.

As depicted in FIG. 10, nitriding is carried out with respect to the surface of the foregoing underlying region having the silicon film 21 and the isolation insulating film 12 to form a silicon nitride film 13. The silicon nitride film 13 is formed using radical nitriding. A method of crying out the foregoing radical nitriding is the same as the first embodiment. According to the radical nitriding, the nitriding condition is set so that the silicon film 21 is fully converted into the silicon nitride film 13.

Figure 11:
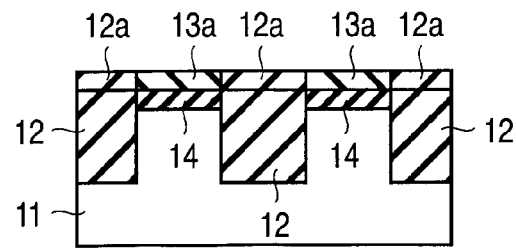
FIG. 11 is a cross-sectional view schematically showing a process of a method of manufacturing a semiconductor device according to a second embodiment.

As seen from FIG. 11, oxidation is carried out with respect to the silicon nitride film 13. The foregoing oxidation is carried out, and thereby, a portion formed on the isolation insulating film 12 of the silicon nitride film 13 is converted into a silicon oxide film 12a. Moreover, a portion 13a formed on the semiconductor substrate 11 of the silicon nitride film 13 is left as a nitride film. The silicon nitride film 13a left on the semiconductor substrate 11 functions as a charge storage insulating film. The foregoing oxidation is carried out using radical oxidation. The method of carrying out the foregoing radical oxidation is the same as the first embodiment. The radical oxidation is carried out, and thereby, the silicon oxide film 12a is formed on the isolation insulating film 12 while the silicon nitride film 13a is left on the semiconductor substrate 11, like the first embodiment.

Figure 12:
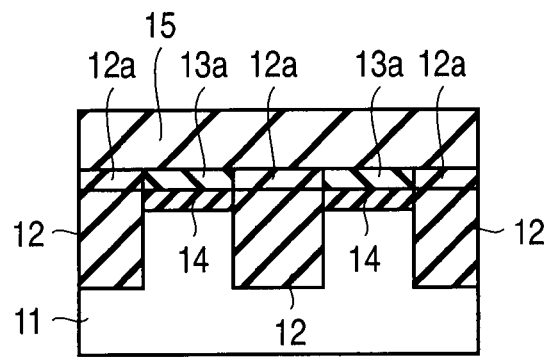
FIG. 12 is a cross-sectional view schematically showing a process of a method of manufacturing a semiconductor device according to a second embodiment.

As shown in FIG. 12, a silicon oxide film having a thickness of about 2 to 20 nm is formed as a block insulating film 15 on the silicon oxide film 12a and the silicon nitride film (i.e., charge storage insulating film) 13a. The method of forming the block insulating film 15 is the same as the first embodiment.

Figure 13:
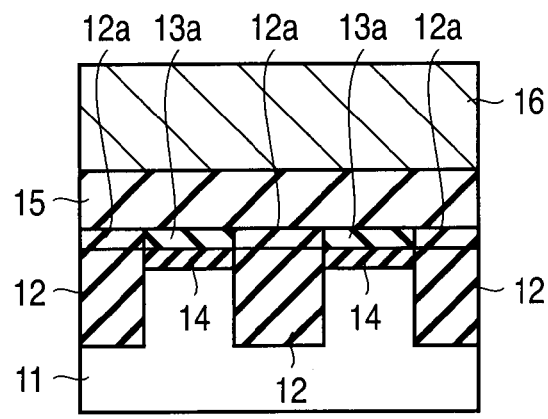
FIG. 13 is a cross-sectional view schematically showing a process of a method of manufacturing a semiconductor device according to a second embodiment.

As illustrated in FIG. 13, a gate electrode film 16 functioning as a control gate electrode is formed on the block insulating film 15. Specifically, a polysilicon film having a thickness of about 10 to 200 nm is formed as the foregoing gate electrode film 16.

In the manner described above, a structure shown in FIG. 13 is formed, and thereafter, the gate electrode film 16 is patterned to obtain a nonvolatile semiconductor device.

According to this embodiment, the charge storage insulating film 13a is not continuously formed between neighboring memory cells; therefore, the charge storage insulating film 13a is separated, as well as the first embodiment. As a result, it is possible to prevent the reduction of charge retention characteristic, and thus, to obtain a semiconductor device having high reliability as well as the first embodiment.

According to this embodiment, radical nitriding and radical oxidation are carried out, and thereby, the silicon oxide film 12a is formed on the isolation insulating film 12 while the silicon nitride film 13a is left on the silicon substrate, as well as the first embodiment. As a result, it is possible to form the silicon nitride film 13a functioning as a charge storage insulating film in a memory cell region only, and thus, to effectively form a semiconductor device, which is excellent in reliability, as well as the first embodiment.

Embodiment 3

FIGS. 14 to 20 are cross-sectional views schematically showing a method of manufacturing a semiconductor device according to a third embodiment. The basic matters are the same as the first embodiment; therefore, the explanation about the matters described in the first embodiment is omitted.

According to this third embodiment, the method of using radical nitriding and radical oxidation described in the first embodiment is applied to the formation of a tunnel insulating film. The tunnel insulating film has an (oxide film/nitride film/oxide film) structure, what is called, an ONO film.

Figure 14:
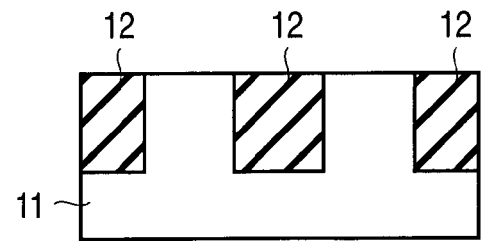
FIG. 14 is a cross-sectional view schematically showing a process of a method of manufacturing a semiconductor device according to a third embodiment.

As shown in FIG. 14, a trench formed on the surface of a silicon substrate 11 is filled with a silicon oxide film to form an isolation insulating film 12, like the first embodiment. In this way, an underlying region having a semiconductor region (i.e., silicon substrate 11) and an insulating region (i.e., isolation insulating film 12) adjacent to the semiconductor region is obtained.

Figure 15:
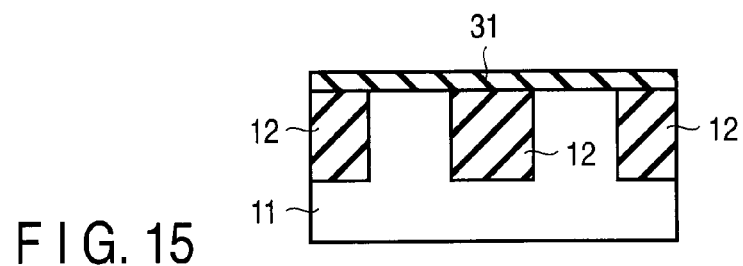
FIG. 15 is a cross-sectional view schematically showing a process of a method of manufacturing a semiconductor device according to a third embodiment.

As illustrated in FIG. 15, the surface of the underlying region having the silicon substrate 11 and the isolation insulating film 12 is nitrided to form a silicon nitride film 31. The silicon nitride film 31 is formed using radical nitriding. The method of carrying out the radical nitriding is the same as the first embodiment.

Figure 16:
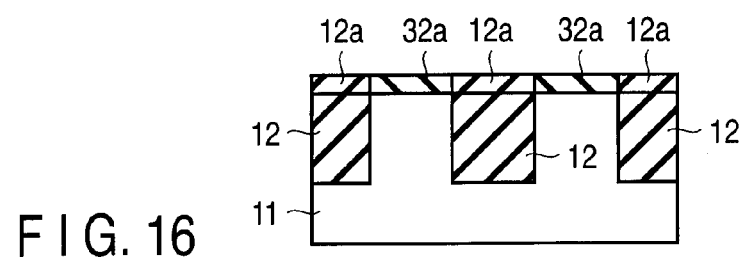
FIG. 16 is a cross-sectional view schematically showing a process of a method of manufacturing a semiconductor device according to a third embodiment.

As depicted in FIG. 16, oxidation is carried out with respect to the silicon nitride film 31. According to the foregoing oxidation, a portion formed on the isolation insulating film 12 of the silicon nitride film 31 is converted into a silicon oxide film 12a. On the other hand, a portion 32a formed on the semiconductor substrate 11 of the silicon nitride film 31 is left as a nitride film. The silicon nitride film 32a left on the semiconductor substrate 11 is used as an intermediate insulating film of a tunnel insulating film (ONO film). The foregoing oxidation is carried out using radical oxidizing. The method of carrying out the radical oxidation is the same as the first embodiment. According to the radical oxidation, a silicon oxide film 12a is formed on an isolation insulating film 12, and a silicon nitride film 32a is left on a silicon substrate 11.

Figure 17:
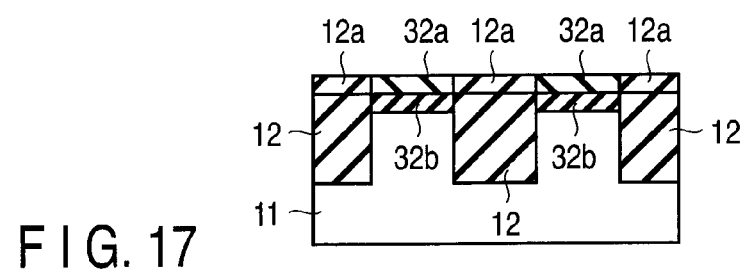
FIG. 17 is a cross-sectional view schematically showing a process of a method of manufacturing a semiconductor device according to a third embodiment.

As seen from FIG. 17, a silicon oxide film 32b is formed as a lower insulating film of a tunnel insulating film between a portion formed with the silicon nitride film 32a and the semiconductor substrate 11. The silicon oxide film 32b is formable using the same method as the method of forming the tunnel insulating film 14 of the first embodiment.

Figure 18:
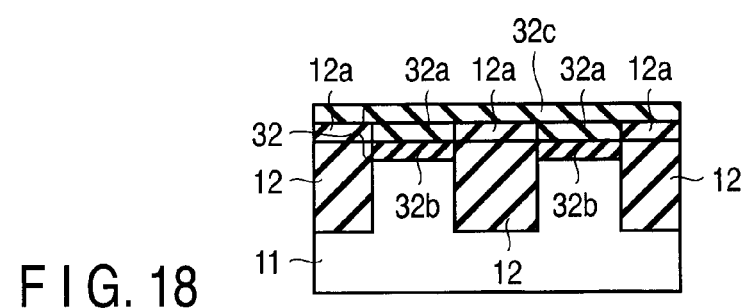
FIG. 18 is a cross-sectional view schematically showing a process of a method of manufacturing a semiconductor device according to a third embodiment.

As shown in FIG. 18, a silicon oxide film 32c is formed as an upper insulating film of a tunnel insulating film on the silicon oxide film 12a and the silicon nitride film (intermediate insulating film of the tunnel insulating film) 32a. The silicon oxide film 32c is formable using a deposition process such as a CVD process, an ALD process and a PVD process. In this way, a tunnel insulating film 32 having an ONO structure, which is formed of the foregoing silicon oxide film (i.e., lower insulating film) 32b, silicon nitride film (intermediate insulating film) 32a and silicon oxide film (i.e., upper insulating film) 32c, is obtained.

As illustrated in FIG. 19, a silicon nitride film having a thickness of 1 to 10 nm is formed as a charge storage insulating film 33 on the tunnel insulating film 32. The silicon nitride film 33 is formed by means of a CVD process using dichloro silane and ammonia. In this case, the silicon nitride film 33 may be formed using an ALD process. Silane, trichloro silane, tetra-chloro silane and hexachloro disilane may be used as a silicon source, in addition to dichloro silane. Moreover, an organic source such as bitertiary butyl amino silane may be used.

As seen from FIG. 20, a silicon oxide film having a thickness of about 2 to 20 nm is formed as a block insulating film 15 on the charge storage insulating film 33. The method of forming the block insulating film 15 is the same as the first embodiment. Further, a gate electrode film 16 functioning as a control gate electrode is formed on the block insulating film. Specifically, a polysilicon film having a thickness of about 10 to 200 nm is formed as the foregoing gate electrode film 16.

In the manner described above, the structure shown in FIG. 20 is obtained, and thereafter, the gate electrode film 16 is patterned to obtain a nonvolatile semiconductor device.

According to this embodiment, the silicon nitride film (i.e., intermediate insulating film of the tunnel insulating film 32) 32a is not continuously formed between neighboring memory cells. Therefore, the silicon nitride film 32a is separated. For this reason, write/erase efficiency is remarkably reduced in areas except a memory cell (i.e., isolation region). The reason why the write/erase efficiency is remarkably reduced in areas except a memory cell is as follows. First, a silicon nitride film having high dielectric constant is not formed in areas except a memory cell; for this reason, an electrical thickness becomes thick. Secondary, a silicon nitride film having low barrier height is not formed with respect to electrons and holes in areas except a memory cell. For this reason, when a high electric field is applied, injection efficiency increasing effect due to an extinction of a barrier is not obtained.

As described above, according to this embodiment, write/erase efficiency is remarkably reduced in areas except a memory cell. In other words, electrons and holes are injected efficiently in a memory cell area only. Therefore, this serves to solve a problem that a charge stored in the charge storage insulating film leaks in the horizontal direction, and to solve a problem that stored electrons are extinct because of being combined with extra holes existing between memory cells. As a result, it is possible to prevent the reduction of charge retention characteristic, and thus, to obtain a semiconductor device having high reliability.

According to this embodiment, radical nitriding is carried out with respect to the surface of the underlying region having the silicon region (i.e., silicon substrate 11) and the silicon oxide film region (i.e., isolation insulating film 12) to form the silicon nitride film 31. Further, radical oxidation is carried out with respect to the silicon nitride film 31. In this way, the silicon oxide film 12a is formed on the isolation insulating film 12 while the silicon nitride film 32a is left on the silicon substrate 11. Therefore, it is possible to form a self-aligned silicon nitride film 32a between isolation regions formed of the isolation insulating film 12 and the silicon oxide film 12a. As a result, a silicon nitride film 32a is formable in the memory cell region only. Therefore, it is possible to effectively form a semiconductor device, which has the foregoing effect and is excellent in reliability.

According to the foregoing embodiment, the nitride film 31 is formed using silicon nitride. In this case, silicon and nitride may be contained in the nitride film 31 as a main component.

According to the foregoing embodiment, the nitride film 32a is formed using a silicon nitride film. In this case, silicon and nitrogen may be contained in the nitride film 32a as a main component. Moreover, according to the foregoing embodiment, oxide films 32b and 32c are formed using a silicon oxide film. In this case, silicon and oxygen may be contained in oxide films 32b and 32c as a main component.

According to the foregoing embodiment, the nitride film (i.e., charge storage insulating film) 33 is formed using a silicon nitride film. In this case, silicon and nitrogen may be contained in the nitride film 33 as a main component.

Embodiment 4

FIGS. 21 to 27 are cross-sectional views schematically showing a method of manufacturing a semiconductor device according to a fourth embodiment. The basic matters are the same as the first embodiment; therefore, the explanation about the matters described in the first embodiment is omitted.

According to this fourth embodiment, the method of using radical nitriding and radical oxidation described in the first embodiment is applied to the formation of a block insulating film. The block insulating film has an (oxide film/nitride film/oxide film) structure, what is called, an ONO film. Moreover, the fourth embodiment relates to a three-dimensional semiconductor device, which is formed in a manner of stacking a plurality of memory cells As shown in FIG. 21, a structure in which a semiconductor region (silicon region) 41 and an insulating region 42 are alternately stacked is formed on the main surface side of a semiconductor substrate (not shown). The semiconductor region 41 functions as a control gate electrode, and is formed of a polysilicon film. The insulating region 42 electrically isolates semiconductor regions, which are adjacent to each other in the stacking direction, and is formed of a silicon oxide film. The stacked structure having the foregoing semiconductor region 41 and insulating region 42 is formed with a hole 43.

Figure 22:
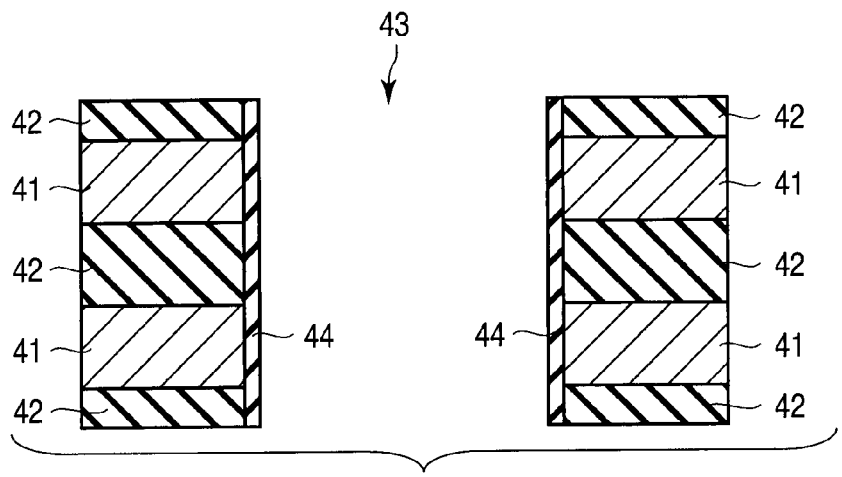
FIG. 22 is a cross-sectional view schematically showing a process of a method of manufacturing a semiconductor device according to a fourth embodiment.

As illustrated in FIG. 22, nitriding is carried out with respect to the surface of an underlying region having the foregoing semiconductor region 41 and insulating region 42 to form a silicon nitride film 44. Namely, the inner wall of the hole 43 is formed with the silicon nitride film 44. The silicon nitride film 44 is formed using radical nitriding. The method of carrying out the foregoing radical nitriding is the same as the first embodiment.

Figure 23:
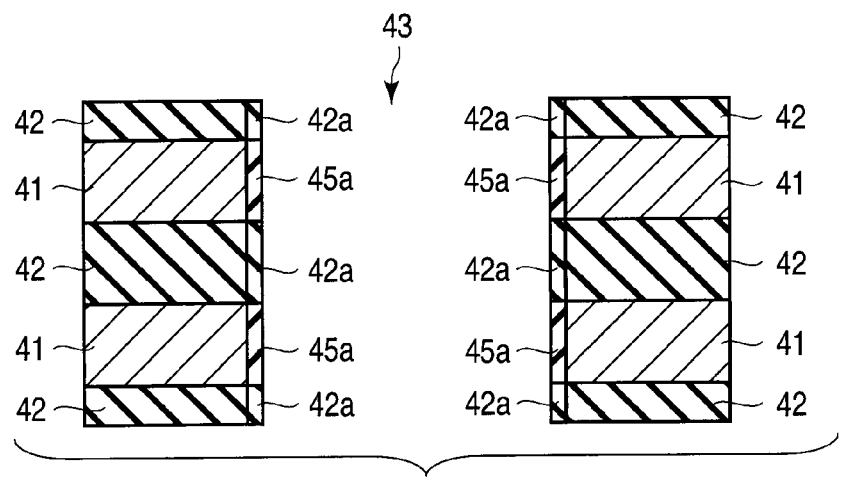
FIG. 23 is a cross-sectional view schematically showing a process of a method of manufacturing a semiconductor device according to a fourth embodiment.

As depicted in FIG. 23, oxidation is carried out with respect to the silicon nitride film 44. The foregoing oxidation is carried out, and thereby, a portion formed on the insulating region 42 of the silicon nitride film 44 is converted into a silicon oxide film 42a. Moreover, a portion 45a formed on the semiconductor region 41 of the silicon nitride film 44 is left as a nitride film. The silicon nitride film 45a left on the semiconductor region 41 is used as an intermediate insulating film of a block insulating film (ONO film). The foregoing oxidation is carried out by radical oxidation. The method of carrying out the radical oxidation is the same as the first embodiment. The radical oxidation is carried out, and thereby, the silicon oxide film 42a is formed on the insulating region 42 while the silicon nitride film 45a is left on the semiconductor region 41.

Figure 24:
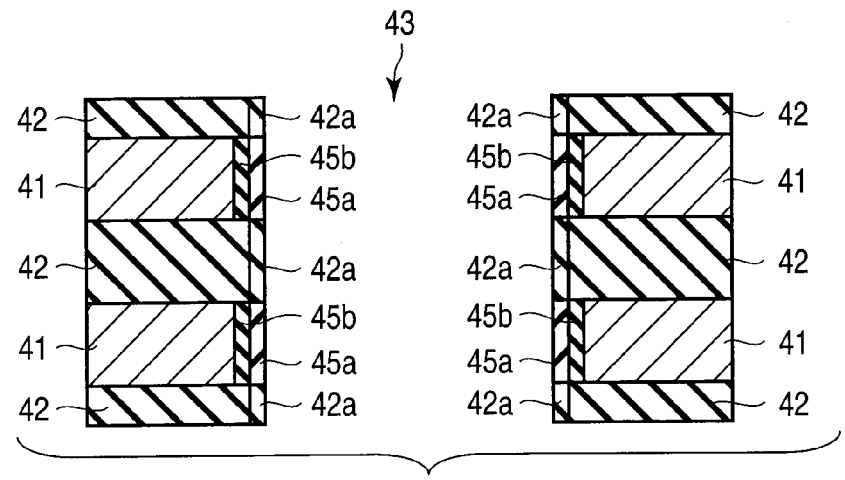
FIG. 24 is a cross-sectional view schematically showing a process of a method of manufacturing a semiconductor device according to a fourth embodiment.

As seen from FIG. 24, a silicon oxide film 45b is formed as a lower insulating film of a block insulating film between a portion formed with the silicon nitride film 45a and the semiconductor region 41. The silicon oxide film 45b is formable using the same method as the method of forming the tunnel insulating film 14 of the first embodiment.

Figure 25:
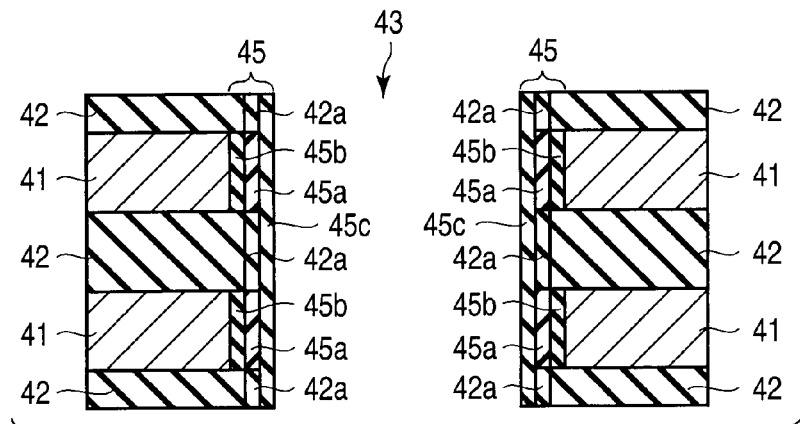
FIG. 25 is a cross-sectional view schematically showing a process of a method of manufacturing a semiconductor device according to a fourth embodiment.

As shown in FIG. 25, a silicon oxide film 45c is formed as an upper insulating film of a block insulating film on the silicon oxide film 42a and the silicon nitride film (intermediate insulating film of block insulating film). The silicon oxide film 45c is formable using a deposition process such as a CVD process, an ALD process and a PVD process. In this ay, a block insulating film 45 having an ONO structure formed of the foregoing silicon oxide film (lower insulating film) 45b, silicon nitride film (intermediate insulating film) 45a and silicon oxide film (upper insulating film) 45c is obtained.

Figure 26:
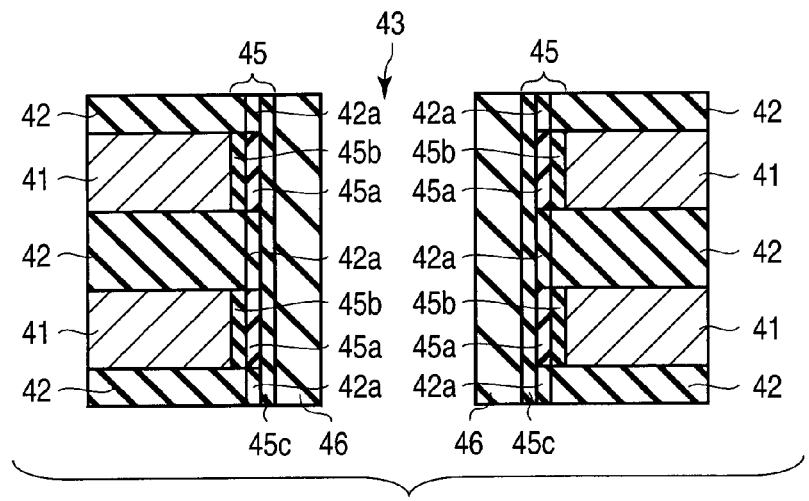
FIG. 26 is a cross-sectional view schematically showing a process of a method of manufacturing a semiconductor device according to a fourth embodiment.

As illustrated in FIG. 26, a silicon nitride film is formed as a charge storage insulating film 46 on the block insulating film 45. The method of forming the foregoing silicon nitride film (charge storage insulating film) 46 is the same as the method of forming the charge storage insulating film 33 of the third embodiment.

Figure 27:
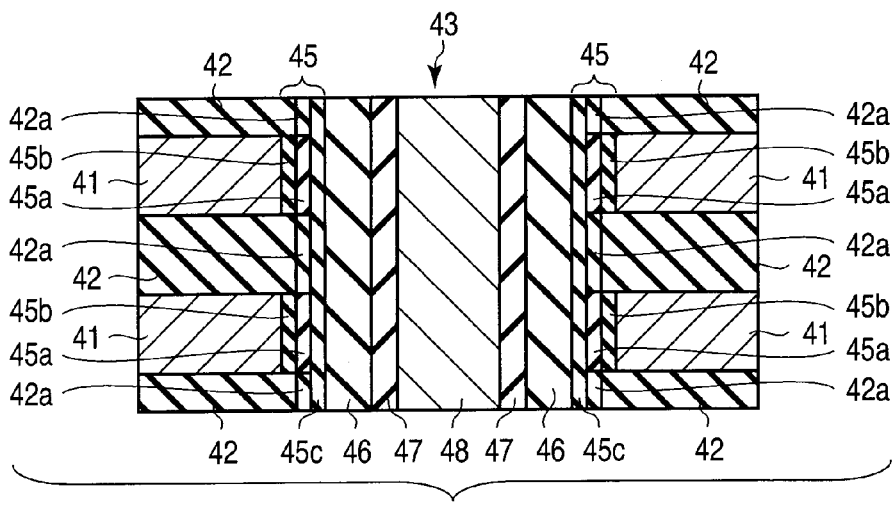
FIG. 27 is a cross-sectional view schematically showing a process of a method of manufacturing a semiconductor device according to a fourth embodiment.

As seen from FIG. 27, a silicon oxide film is formed as a tunnel insulating film 47 on the charge storage insulating film 46. Further, a semiconductor active region 48 is formed on the tunnel insulating film 47 so that the hole 43 is filled with the semiconductor active region 48. The semiconductor active region 48 is formed of a silicon film.

In the manner described above, the structure shown in FIG. 27 is formed, and thereafter, a gate electrode film (i.e., semiconductor region 41) is patterned, and thereby, a nonvolatile semiconductor device is obtained.

According to this embodiment, the silicon nitride film (intermediate insulating film of the block insulating film 45) 45a is not continuously formed between neighboring memory cells. Therefore, the silicon nitride film 45a is separated. For this reason, a silicon nitride film having high dielectric constant is not formed in areas except a memory cell (i.e., insulating region). As a result, the electrical thickness becomes thick; for this reason, write/erase efficiency is remarkably reduced. In other words, electrons and holes are injected efficiently in a memory cell area only. Therefore, this serves to solve a problem that a charge stored in the charge storage insulating film leaks in the horizontal direction, and to solve a problem that stored electrons are extinct because of being combined with extra holes existing between memory cells. As a result, it is possible to prevent the reduction of charge retention characteristic, and thus, to obtain a semiconductor device having high reliability.

According to this embodiment, radical nitriding is carried out with respect to the surface of the underlying region having the silicon region (semiconductor region 41) and the silicon oxide film region (insulating region 42) to form the silicon nitride film 44. Further, radical oxidation is carried out with respect to the silicon nitride film 44. In this way, the silicon oxide film 42a is formed on the insulating region 42 while the silicon nitride film 45a is left on the semiconductor region 41. Therefore, it is possible to form a self-aligned silicon nitride film 45a on the surface only of the semiconductor region 41. As a result, a silicon nitride film 45a is formable on the memory cell region only. Therefore, it is possible to effectively form a semiconductor device, which has the foregoing effect and is excellent in reliability.

According to the foregoing embodiment, the block insulating film 45 in a memory cell region is formed having a (oxide film/nitride film/oxide film) structure, that is, an ONO film. Therefore, it is possible to prevent high electric field leakage, and obtain a semiconductor device, which is excellent in a charge retention characteristic and has high reliability in the light of above.

According to the foregoing embodiment, the semiconductor region 41 is formed using silicon. In this case, silicon may be contained in the semiconductor region 41 as a main component. For example, the semiconductor region may be formed of SiGe (silicon germanium).

According to the foregoing embodiment, the insulating region 42 is formed using a silicon oxide film. In this case, silicon and oxygen may be contained in the insulating region 42 as a main component.

According to the foregoing embodiment, the nitride film 44 is formed using a silicon nitride film. In this case, silicon and nitrogen may be contained in the nitride film 44 as a main component.

According to the foregoing embodiment, the oxide film 42a is formed using a silicon oxide film. In this case, silicon and oxygen may be contained in the oxide film 42a as a main component.

According to the foregoing embodiment, the nitride film 45a left on the semiconductor region after radical oxidation is formed using a silicon nitride film. In this case, silicon and nitrogen may be contained in the nitride film 45a as a main component. Moreover, according to the foregoing embodiment, the oxide films 45b and 45c is formed using a silicon oxide film. In this case, silicon and oxygen may be contained in the oxide films 45b and 45c as a main component.

According to the foregoing embodiment, the nitride film (charge storage insulating film) 46 is formed using a silicon nitride film. In this case, silicon and nitrogen may be contained in the nitride film 46 as a main component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the sprit of the inventions. The accompanying claims and their equivalents are intended to cover such forms or modifications as would fall within the scope and spirit of the inventions.

What is claimed is:

1. A method of manufacturing a semiconductor device, comprising:

forming a nitride film by nitriding a surface of an underlying region having a semiconductor region containing silicon as a main component and an insulating region containing silicon and oxygen as a main component and adjacent to the semiconductor region;

carrying out oxidation with respect to the nitride film to convert a portion of the nitride film which is formed on the insulating region into an oxide film and to leave a portion of the nitride film which is formed on the semiconductor region as at least part of a charge storage insulating film;

forming a block insulating film on the charge storage insulating film; and forming a gate electrode film on the block insulating film.

2. The method according to claim 1, wherein forming the nitride film is carried out using radical nitriding.

3. The method according to claim 1, wherein carrying out the oxidation is carried out using radical oxidation.

4. The method according to claim 1, further comprising:

forming a tunnel insulating film between the semiconductor region and the portion of the nitride film which is formed on the semiconductor region after carrying out the oxidation.

5. The method according to claim 4, wherein the tunnel insulating film is obtained by increasing a thickness of an oxide film formed between the semiconductor region and the portion of the nitride film which is formed on the semiconductor region.

6. The method according to claim 1, wherein the semiconductor region includes a surface region of a semiconductor substrate.

7. The method according to claim 1, further comprising:

forming a structure having a tunnel insulating film and the semiconductor region formed on the tunnel insulating film before forming the nitride film.

8. A method of manufacturing a semiconductor device, comprising:

forming a nitride film by nitriding a surface of an underlying region having a semiconductor region containing silicon as a main component and an insulating region containing silicon and oxygen as a main component and adjacent to the semiconductor region;

carrying out oxidation with respect to the nitride film to convert a portion of the nitride film which is formed on the insulating region into an oxide film and to leave a portion of the nitride film which is formed on the semiconductor region as at least part of a tunnel insulating film;

forming a charge storage insulating film on the tunnel insulating film;

forming a block insulating film on the charge storage insulating film; and forming a gate electrode film on the block insulating film.

9. The method according to claim 8, wherein forming the nitride film is carried out using radical nitriding.

10. The method according to claim 8, wherein carrying out the oxidation is carried out using radical oxidation.

11. The method according to claim 8, wherein said at least part of the tunnel insulating film corresponds to an intermediate insulating film of the tunnel insulating film.

12. The method according to claim 11, further comprising:

forming a lower insulating film of the tunnel insulating film between the semiconductor region and the portion of the nitride film which is formed on the semiconductor region after carrying out the oxidation; and forming an upper insulating film of the tunnel insulating film on the intermediate insulating film of the tunnel insulating film after forming the lower insulating film of the tunnel insulating film.

13. The method according to claim 8, wherein the semiconductor region includes a surface region of a semiconductor substrate.

14. A method of manufacturing a semiconductor device, comprising:

forming a nitride film by nitriding a surface of an underlying region having a semiconductor region containing silicon as a main component and an insulating region containing silicon and oxygen as a main component and adjacent to the semiconductor region;

carrying out oxidation with respect to the nitride film to convert a portion of the nitride film which is formed on the insulating region into an oxide film and to leave a portion of the nitride film which is formed on the semiconductor region as at least part of a block insulating film;

forming a charge storage insulating film on the block insulating film;

forming a tunnel insulating film on the charge storage insulating film; and forming a semiconductor active region on the tunnel insulating film.

15. The method according to claim 14, wherein forming the nitride film is carried out using radical nitriding.

16. The method according to claim 14, wherein carrying out the oxidation is carried out using radical oxidation.

17. The method according to claim 14, wherein the semiconductor region and the insulating region are stacked, and the semiconductor region corresponds to a gate electrode film.

18. The method according to claim 17, wherein the nitride film is formed on an inner surface of a hole formed in a structure including the semiconductor region and the insulating region, which are stacked.

* * * * *